(12) United States Patent
Yang et al.

(10) Patent No.: US 8,080,192 B2
(45) Date of Patent: Dec. 20, 2011

(54) VOLUME-BASED DISPENSING CONTROL METHOD

(75) Inventors: Ki Man Yang, Geongi-do (KR); Soojin Lee, Incheon-si (KR); Minkyu Choi, Incheon-si (KR)

(73) Assignee: Protec Co., Ltd., Namdong-gu, Incheon (KR)

( * ) Notice: Subject to any disclaimer, the term of this patent is extended or adjusted under 35 U.S.C. 154(b) by 185 days.

(21) Appl. No.: 12/650,685

(22) Filed: Dec. 31, 2009

(65) Prior Publication Data

US 2010/0327468 A1 Dec. 30, 2010

(30) Foreign Application Priority Data

Jun. 29, 2009 (KR) .................. 10-2009-0058285

(51) Int. Cl.
*H01L 21/56* (2006.01)
(52) U.S. Cl. ........................................ 264/40.4
(58) Field of Classification Search ............ 264/1.1, 264/40.4
See application file for complete search history.

(56) References Cited

U.S. PATENT DOCUMENTS

| | | | | |
|---|---|---|---|---|
| 5,518,388 A | * | 5/1996 | Swenor et al. | 425/144 |
| 7,480,027 B2 | * | 1/2009 | Inoue et al. | 349/190 |
| 2008/0137106 A1 | * | 6/2008 | Ono | 356/630 |
| 2010/0244296 A1 | * | 9/2010 | Keys | 264/40.1 |

* cited by examiner

*Primary Examiner* — Jill Heitbrink
(74) *Attorney, Agent, or Firm* — Ladas & Parry LLP

(57) ABSTRACT

A volume-based dispensing control method is capable of enabling a pump to dispense a resin with greatly increased accuracy. The method includes: a preliminary dispensing step in which a resin is dispensed on one or more workpieces with a pump; a volume measuring step in which the workpieces passed through the preliminary dispensing step is scanned by an optical scanner to measure a dispensed resin volume; a corrected-volume calculating step in which a corrected volume of the resin to be additionally dispensed is calculated by using a difference between the dispensed resin volume measured in the volume measuring step and a predetermined dispensing volume; and a corrective dispensing step in which the resin is dispensed on the workpieces in light of the corrected volume calculated in the corrected-volume calculating step.

17 Claims, 4 Drawing Sheets

VOLUME-BASED DISPENSING CONTROL METHOD

FIELD OF THE INVENTION

The present invention relates to a dispensing control method and, more particularly, to a volume-based dispensing control method capable of enabling a pump to dispense a resin with greatly increased accuracy.

BACKGROUND OF THE INVENTION

A dispenser for continuously dispensing a specified quantity of resin in the course of producing electronic parts is extensively used in a semiconductor manufacturing process. The resin used in the semiconductor manufacturing process serves to bond, cover and protect a semiconductor device. Examples of the dispensing step include an underfill step and an LED mold formation step, which steps are automatically performed by a resin-applying dispenser.

In particular, the dispensing step is essential in an LED manufacturing process in order to dispense silicon containing a fluorescent material on a package provided with an LED chip to thereby adjust the color of light emitted from the LED chip and to structurally stabilize the LED chip.

It is of paramount importance that an accurate quantity of resin is applied on workpieces in the LED mold formation step or the underfill step. If the dispensing quantity of resin is inaccurate, it may be a cause of generating defective products. This results in reduced productivity and increased manufacturing cost.

Conventionally, the dispensing quantity of resin is controlled by measuring the weight of the dispensed resin with a scale and feeding the measurement result back to a dispensing control unit.

It is however typical that the minimum weight measurable through the use of a scale is greater than the minimum dispensing quantity of resin adjustable by the pump of a dispenser. This limits the accuracy of measurement made by the scale, which necessarily reduces the accuracy of controlling the dispensing quantity of resin. In case of using a jet-type pump, the dispensing quantity is controlled by counting the number of droplets dispensed. In general, the minimum weight measurable with the scale is greater than the weight of one of the droplets. This means that the dispensing quantity cannot be adjusted on a droplet-by-droplet basis according to the scale measurement method. When using a screw-type pump, it is general that the quantity of the resin dispensed in proportion to the rotational angle of a screw cannot be accurately measured with a scale.

A high precision scale may be used to accurately control the dispensing quantity of resin. However, this poses a problem in that the total manufacturing cost of the dispenser becomes quite unreasonable. In addition, use of the scale imposes a restriction on the weight measurement speed, consequently reducing the overall manufacturing speed.

SUMMARY OF THE INVENTION

In view of the problems inherent in the prior art, it is an object of the present invention to provide a volume-based dispensing control method that can accurately control the quantity of dispensed resin by accurately measuring the volume of the resin dispensed by a pump and feeding the measurement result to a control unit.

With the above object in view, the present invention provides a volume-based dispensing control method, including: a preliminary dispensing step in which a resin is dispensed on one or more workpieces with a pump; a volume measuring step in which the workpieces passed through the preliminary dispensing step is scanned by an optical scanner to measure a dispensed resin volume; a corrected-volume calculating step in which a corrected volume of the resin to be additionally dispensed is calculated by using a difference between the dispensed resin volume measured in the volume measuring step and a predetermined dispensing volume; and a corrective dispensing step in which the resin is dispensed on the workpieces in light of the corrected volume calculated in the corrected-volume calculating step.

The volume-based dispensing control method according to the present invention has an advantageous effect in that the quantity of the resin dispensed by a pump can be accurately controlled by accurately measuring the volume of the dispensed resin with an optical scanner.

Another advantageous effect of the present method resides in that the quantity of the dispensed resin can be rapidly measured, thereby enhancing the efficiency of a dispensing operation.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENTS

Certain preferred embodiments of the present invention will now be described in detail with reference to the accompanying drawings.

Figure 1:
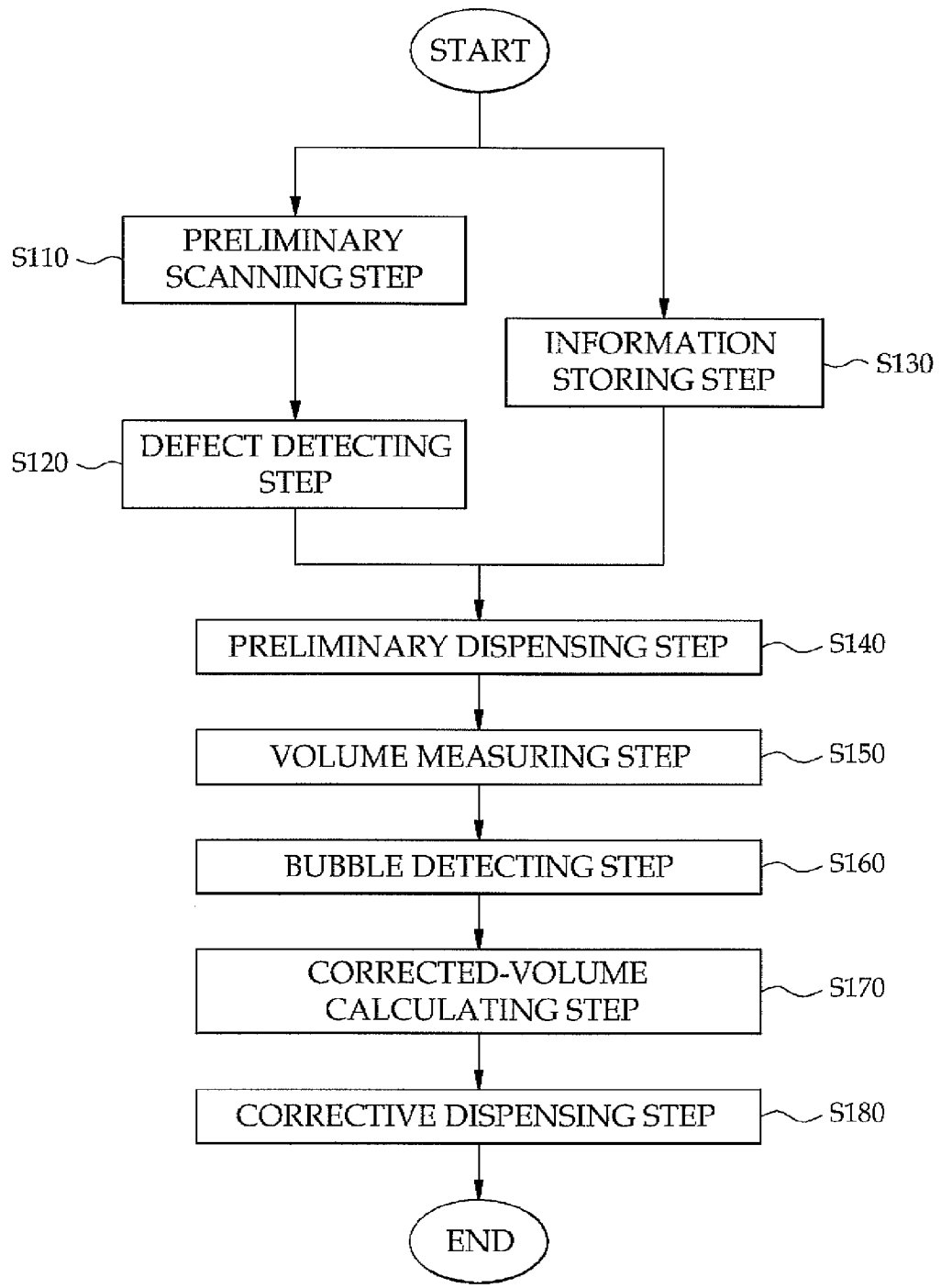
FIG. 1 is a flowchart illustrating a volume-based dispensing control method in accordance with a first embodiment of the present invention.
Figure 2:
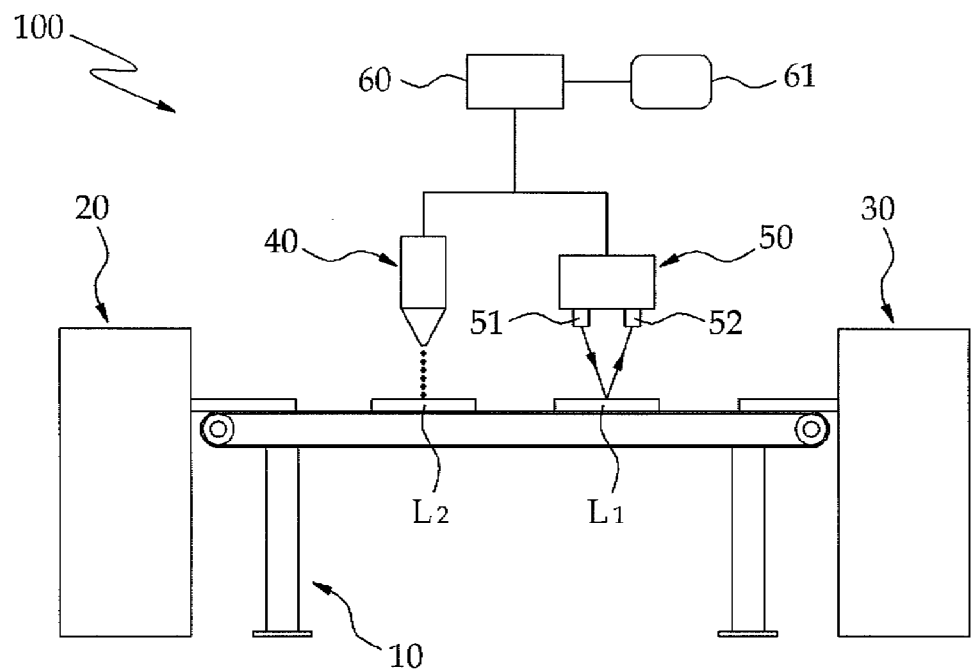
FIG. 2 is a schematic diagram showing a dispenser by which to perform the volume-based dispensing control method illustrated in FIG. 1.

FIG. 1 is a flowchart illustrating a volume-based dispensing control method in accordance with a first embodiment of the present invention, and FIG. 2 is a schematic diagram showing a dispenser by which to perform the volume-based dispensing control method illustrated in FIG. 1.

Referring first to FIG. 2, there is shown one example of a dispenser 100 by which to perform the volume-based dispensing control method of the present invention. The dispenser 100 includes a base 10, a loader 20, an unloader 30, a pump 40 and an optical scanner 50.

The loader 20 serves to feed substrates or lead frames L1 and L2 mounted with a plurality of workpieces 80 to the base 10. The following description will be directed to an instance where the lead frames L1 and L2 are fed by the loader 20. The loader 20 feeds the lead frames L1 and L2 in a state that the workpieces 80 are mounted to the lead frames L1 and L2. At the end of a dispensing operation, the lead frames L1 and L2 are transferred to and stored in the unloader 30.

On the base 10, there is installed a workpiece transfer device (not shown) capable of feeding or transferring the lead frames L1 and L2 toward the unloader 30 along a workpiece feeding path. A pump 40 and an optical scanner 50 are installed on the base 10 to lie above the workpiece transfer device. The pump 40 and the optical scanner 50 are arranged one after another along the workpiece feeding path. The workpiece transfer device feeds or transfers the workpieces so that they can pass through the pump 40 and the optical scanner 50.

The pump 40 is installed on the base 10 in such a way that it can move with respect to the base 10 in a back-and-forth direction, a left-and-right direction and a vertical direction. The pump 40 serves to dispense a resin such as silicon or epoxy on the workpieces 80. The optical scanner 50 is arranged at the downstream side of the pump 40.

The optical scanner 50 includes a light source 51 for emitting laser light or other visible light and a light receiver 52 for receiving the light. The light emitted from the light source 51 is reflected by the workpieces 80 moving below the light source 51 and then received by the light receiver 52. The optical scanner 50 serves to analyze the light sensed by the light receiver 52 and calculate the height of the top surface of each of the workpieces 80. The lead frames L1 and L2 passed through the optical scanner 50 are transferred to the unloader 30 that stores the lead frames L1 and L2 therein.

The pump 40 and the optical scanner 50 are connected to a control unit 60 that controls the operations thereof. Also connected to the control unit 60 is a storage unit 61 that stores the information required to perform the dispensing operation.

Figure 3:
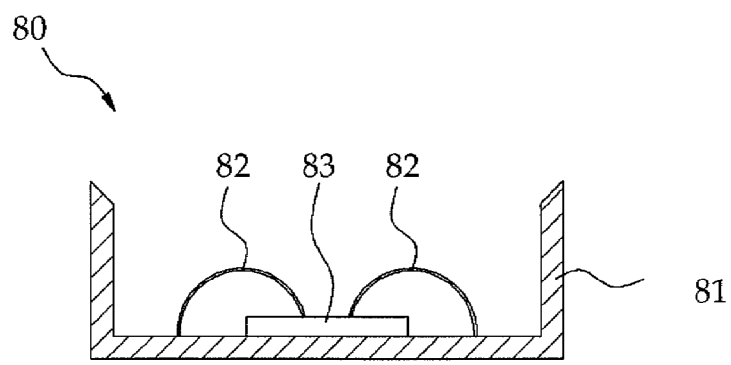
FIGS. 3 through 5 illustrate the steps of manufacturing a product according to the volume-based dispensing control method illustrated in FIG. 1.
Figure 4:
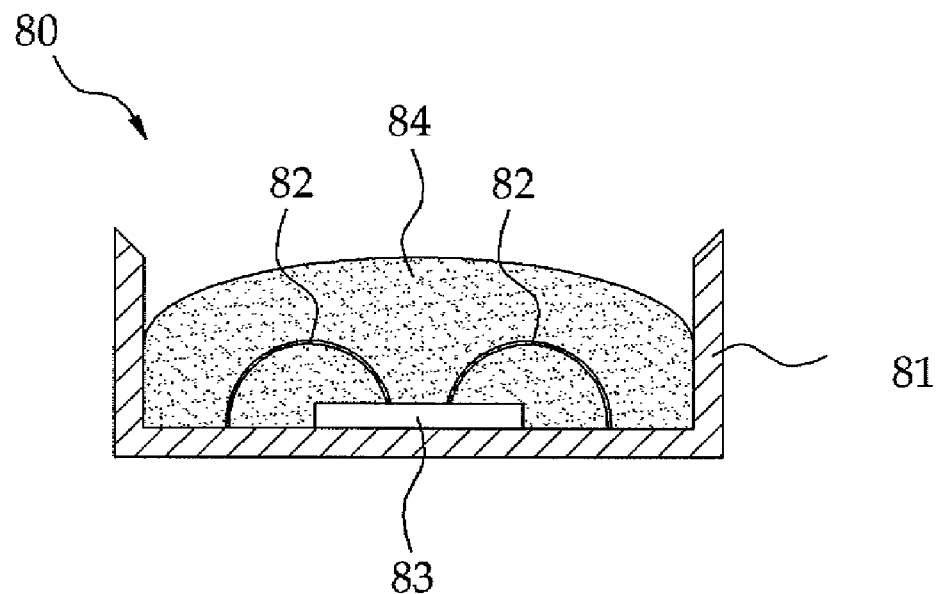
Figure 5:
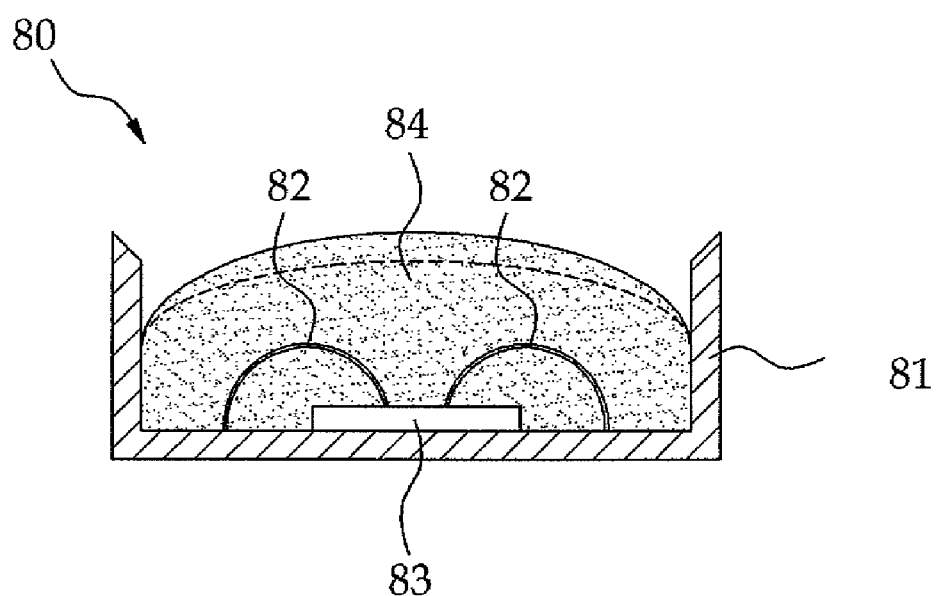

Hereinafter, a volume-based dispensing control method in accordance with a first embodiment of the present invention will be described with reference to an instance where the silicon 84 containing a fluorescent material is dispensed on a light-emitting diode by means of the dispenser 100 as shown in FIGS. 3 through 5.

An information storing step S130 is performed first. LED chips 83 of each of the LED elements 80 as workpieces may differ in property from one another. The dispensing quantity of the silicon 84 varies with the properties of the LED chips 83. The dispensing quantity of the silicon 84 preset for each of the LED chips 83 mounted to the lead frames L1 and L2 is referred to as dispensing volume information. The dispensing volume information is received from a workpiece supplier and stored in the storage unit 61.

Performed next is a preliminary scanning step S110. The lead frames L1 and L2 fed by the loader 20 are allowed to pass below the optical scanner 50. The three-dimensional shape of the LED elements 80 mounted to the lead frames L1 and L2 is detected by the optical scanner 50. At this time, the LED chip 83 is in the state illustrated in FIG. 3. The LED chip 83 is bonded to the electrodes of the package by wires 82 within the package. The optical scanner 50 scans the three-dimensional shape of the LED element 80 on which the silicon 84 is not yet dispensed as illustrated in FIG. 3.

A typical optical scanner for scanning the external shape of an object is used as the optical scanner 50. The optical scanner 50 makes use of laser light or visible light. Use of the visible light in scanning the external shape of an object has an advantage in that it becomes possible to obtain the information on an object image.

In case where the external shape of the LED element 80 is scanned with the visible light, a defect detecting step S120 is performed in which the control unit 60 determines the existence or absence of a defect in the LED element 80, e.g., the disconnection of the wire 82 of the LED element 80, through the use of an image processing method. If the LED element 80 is determined to be defective in the defect detecting step S120, no dispensing operation is performed with respect to the defective LED element 80. This assists in reducing the loss of time and increasing the operation speed.

In case where the light source 51 of the optical scanner 50 is designed to generate laser light rather than visible light, a camera is additionally provided to obtain the image of the LED element 80 in the defect detecting step S120. The camera may not be provided, in which case the next step is performed without carrying out the defect detecting step S120.

Performed next is a preliminary dispensing step S140 in which a resin is dispensed on the LED element 80 by means of the pump 40. More specifically, the silicon 84 is dispensed on the LED element 80 as illustrated in FIG. 4. At this time, the quantity of the silicon 84 dispensed on the LED element 80 is a little smaller than the dispensing quantity pre-stored in the information storing step S140. After the silicon 84 is dispensed on all of the LED elements 80 mounted to the lead frames L1 and L2 in this manner, a volume measuring step S150 is carried out.

More specifically, if the lead frames L1 and L2 that have undergone the preliminary dispensing step S140 are fed to the optical scanner 50 by the workpiece transfer device, the volume measuring step S150 is performed in which the optical scanner 50 scans the three-dimensional shape of the LED elements 80 by use of the light source 51 and the light receiver 52. The volume of the silicon 84 dispensed is measured by calculating the difference between the volume of the LED element 80 measured in the volume measuring step S150 and the volume of the LED element 80 measured in the preliminary scanning step S110.

Performed next is a bubble detecting step S160 in which the bubbles contained in the dispensed resin are detected using the image captured by the optical scanner 50. More specifically, presence or absence of the bubbles in the dispensed silicon 84 is determined using either the image scanned by the optical scanner 50 in case of the light source 51 of the optical scanner 50 being the visible light or the image captured by the camera in case of the light source 51 being the laser light. The workpieces such as the LED elements 80 or the like are regarded as being defective if bubbles are contained the dispensed silicon 84. Thus, it is possible to increase the product quality by checking out the presence or absence of the bubbles in advance. The LED element 80 containing the bubbles is not subjected to the subsequent operation, which assists in reducing the loss of time and increasing the operation speed.

Performed next is a corrected-volume calculating step S170. More specifically, the control unit 60 calculates the quantity of the silicon 84 to be additionally dispensed by calculating the difference between the dispensing quantity of the silicon 84 stored in the storage unit 61 as the dispensing volume information and the volume of the silicon measured in the volume measuring step S150. The corrected-volume of the silicon 84 is calculated for each of the LED elements 80 mounted to the lead frames L1 and L2 and is stored in the storage unit 61. Then, the workpiece transfer device feeds the lead frames L1 and L2 to below the pump 40.

In this state, the control unit 60 controls the pump 40 to perform a corrective dispensing step S180. The pump 40 additionally dispenses a corrected-volume of the silicon 84 on the LED elements 80 mounted to the lead frames L1 and L2 as illustrated in FIG. 5. In case where a jet-type pump is used as the pump 40, the corrective dispensing step S180 can be performed by ejecting droplets of the silicon 84 by the number of times calculated in advance. In the event that a screw-type pump is used as the pump 40, the corrective dispensing step S180 can be carried out by rotating a screw by the angle calculated in advance. The lead frames L1 and L2 that have undergone the corrective dispensing step S180 are transferred to the unloader 30 by the workpiece transfer device, thereby terminating the dispensing operations.

In the conventional method in which the resin dispensing quantity is controlled using a scale, the reduced accuracy of the scale makes it difficult to accurately control the resin dispensing quantity. In contrast, use of the optical scanner 50 helps drastically increase the dispensing accuracy. Typically, the optical scanner 50 has resolution power of less than several micrometers. This makes it possible to secure the dispensing accuracy quite higher than that available in case of controlling the dispensing quantity with a scale. In addition, the speed at which the dispensing quantity is measured by the optical scanner 50 is far faster than the speed at which the dispensing quantity is measured by the scale. This makes it possible to greatly increase the efficiency of the dispensing operation.

Figure 6:
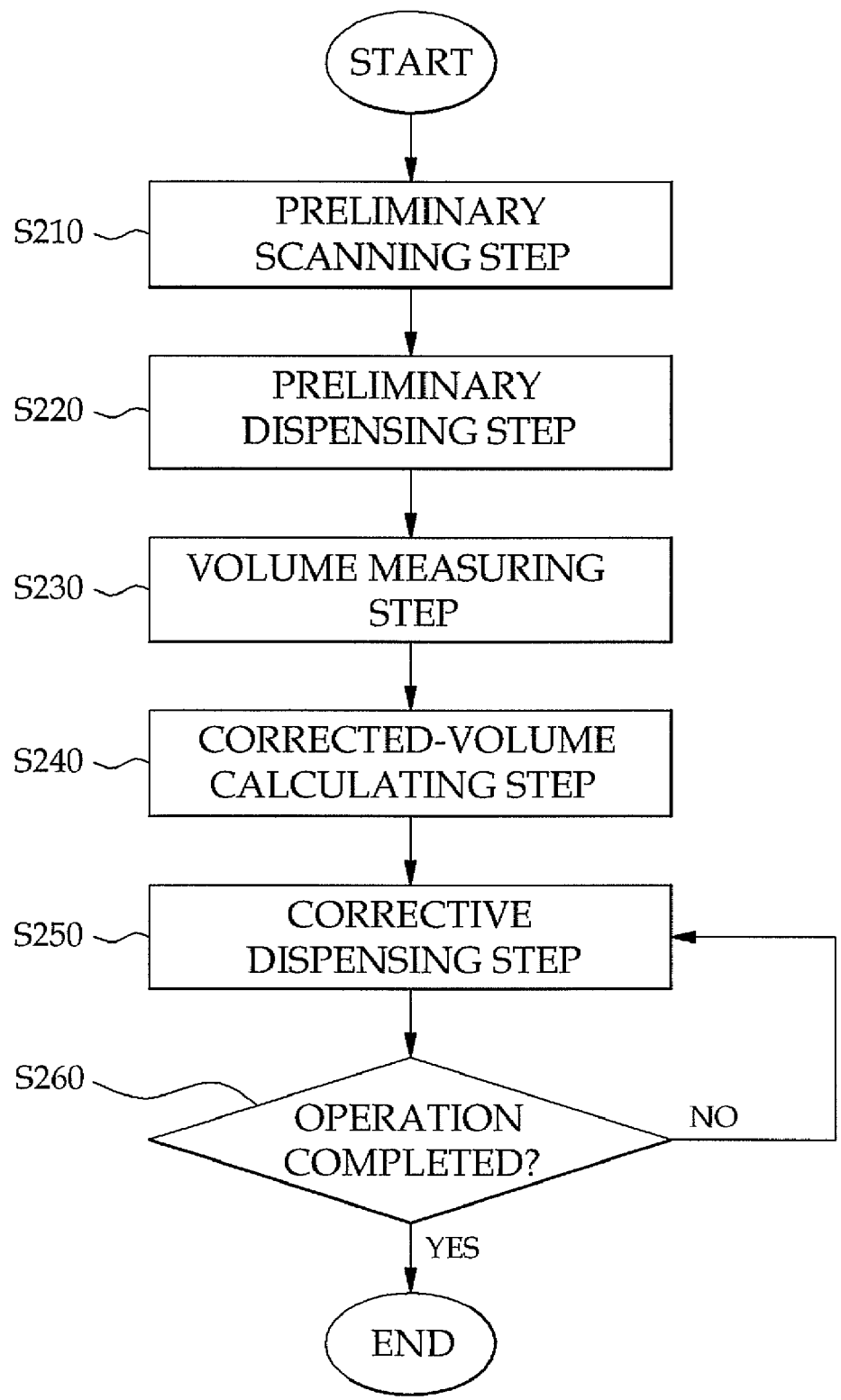
FIG. 6 is a flowchart illustrating a volume-based dispensing control method in accordance with a second embodiment of the present invention.

Next, a volume-based dispensing control method in accordance with a second embodiment of the present invention will be described with reference to FIG. 6.

In the volume-based dispensing control method of the second embodiment, the dispensing operation is performed by the dispenser 100 shown in FIG. 2. As distinguished from the method of the first embodiment in which the quantities of the silicon 84 to be dispensed vary with the LED elements 80, the method of the second embodiment is performed in case where the quantities of the silicon 84 to be dispensed are kept constant for all of the LED elements 80.

First, the total volume of the LED element 80 available prior to dispensing the silicon 84 is calculated by performing a preliminary scanning step S210 in which the three-dimensional shape of the LED element 80 is scanned in the state illustrated in FIG. 3.

Performed next is a preliminary dispensing step S220 in which the silicon 84 is dispensed on the LED element 80 in the quantity a little smaller than the proper dispensing quantity as illustrated in FIG. 4.

In this state, a volume measuring step S230 is performed by the optical scanner 50 to measure the quantity of the silicon 84 dispensed. Then, a corrected-volume calculating step S240 is carried out to calculate the corrected volume of the silicon 84 still in shortage. Using the corrected volume, the control unit 60 calculates and stores the corrected quantity of the silicon 84 to be additionally dispensed by the pump 40. Then, the control unit 60 controls the pump 40 so that it can dispense the silicon 84 on the LED element 80 in the corrected quantity. After the quantity of the silicon 84 to be additionally dispensed is corrected using the optical scanner 50, the silicon 84 is dispensed on all of the LED elements 80 of the lead frames L1 and L2 in the corrected quantity. This step is referred to as corrective dispensing step S250. As distinguished from the corrective dispensing step S180 of the first embodiment in which the silicon 84 in shortage is supplemented in different quantities for the respective LED elements 80 as illustrated in FIG. 4, the corrective dispensing step S250 of the second embodiment is performed in such a way that the silicon 84 is dispensed on all of the LED elements 80 of the lead frames L1 and L2 in the single corrected quantity stored in the storage unit 61. Once the corrective dispensing step S250 comes to an end, it is confirmed in step S260 whether the dispensing operation has been completed for all of the LED elements 80 of the lead frames L1 and L2. The corrective dispensing step S250 is repeatedly performed until the dispensing operation is completed.

In the volume-based dispensing control method of the second embodiment, the corrected volume is calculated with respect to the LED elements 80 to correct the quantity of the silicon 84 to be additionally dispensed by the pump 40. Thereafter, the silicon 84 is dispensed on the LED element according to the corrected volume. This offers an advantage in that the dispensing operation can be rapidly performed if the quantities of the silicon 84 to be dispensed on the respective LED elements 80 of the lead frames L1 and L2 are equal to one another.

While certain preferred embodiments of the invention have been described hereinabove, the present invention is not limited thereto but may be modified in many different forms.

For example, the defect detecting step S120 and the bubble detecting step S160 performed in the method of the first embodiment may be omitted depending on the properties of the workpieces.

In addition, the preliminary scanning step S110 or S210 performed in the methods of the first and second embodiments may be omitted. It is not always necessary to scan the three-dimensional shape of the workpieces with the optical scanner 50. The information on the external shape of the workpieces obtained in other methods may be preliminarily provided to the control unit 60. Then, the dispensing quantity of the resin to be corrected in the corrected-volume calculating step S170 may be calculated using the information.

Furthermore, the volume of the workpieces or the silicon may be calculated by measuring the distance between the inner upper end of the package and the contour line of the silicon, instead of using the three-dimensional scanning method.

Moreover, examples of the workpiece are not limited to the LED element 80 but may include many different kinds of electronic parts to be subjected to an underfill step or other like steps.

What is claimed is:

1. A volume-based dispensing control method, comprising:
   a preliminary dispensing step in which a resin is dispensed on one or more workpieces with a pump;
   a volume measuring step in which the workpieces passed through the preliminary dispensing step is scanned by an optical scanner to measure a dispensed resin volume;
   a corrected-volume calculating step in which a corrected volume of the resin to be additionally dispensed is calculated by using a difference between the dispensed resin volume measured in the volume measuring step and a predetermined dispensing volume; and
   a corrective dispensing step in which the resin is dispensed on the workpieces in light of the corrected volume calculated in the corrected-volume calculating step.

2. The method as recited in claim 1, wherein the volume of the resin dispensed in the corrective dispensing step is equal to the corrected volume calculated in the corrected-volume calculating step.

3. The method as recited in claim 2, wherein the workpieces passed through the preliminary dispensing step are subjected, one by one, to the volume measuring step and the corrected-volume calculating step and then to the corrective dispensing step.

4. The method as recited in claim 3, further comprising an information storing step in which resin dispensing volumes are preset for the workpieces and stored in a storage unit, and wherein, in the corrected-volume calculating step, the corrected volume of the resin to be additionally dispensed is calculated using the resin dispensing volumes stored in the storage unit.

5. The method as recited in claim 1, wherein, in the corrective dispensing step, the resin is dispensed on the workpieces in a fixed quantity calculated in light of the dispensed resin volume and the corrected volume.

6. The method as recited in claim 2, further comprising a preliminary scanning step in which the workpieces are scanned by the optical scanner before the preliminary dispensing step to measure a workpiece volume, and wherein, in the corrected-volume calculating step, the corrected volume is calculated using the difference between the dispensed resin volume measured in the volume measuring step and the workpiece volume measured in the preliminary scanning step.

7. The method as recited in claim 3, further comprising a preliminary scanning step in which the workpieces are scanned by the optical scanner before the preliminary dispensing step to measure a workpiece volume, and wherein, in the corrected-volume calculating step, the corrected volume is calculated using the difference between the dispensed resin volume measured in the volume measuring step and the workpiece volume measured in the preliminary scanning step.

8. The method as recited in claim 4, further comprising a preliminary scanning step in which the workpieces are scanned by the optical scanner before the preliminary dispensing step to measure a workpiece volume, and wherein, in the corrected-volume calculating step, the corrected volume is calculated using the difference between the dispensed resin volume measured in the volume measuring step and the workpiece volume measured in the preliminary scanning step.

9. The method as recited in claim 5, further comprising a preliminary scanning step in which the workpieces are scanned by the optical scanner before the preliminary dispensing step to measure a workpiece volume, and wherein, in the corrected-volume calculating step, the corrected volume is calculated using the difference between the dispensed resin volume measured in the volume measuring step and the workpiece volume measured in the preliminary scanning step.

10. The method as recited in claim 2, wherein the optical scanner used in the volume measuring step includes a light source for generating laser light.

11. The method as recited in claim 2, wherein the optical scanner used in the volume measuring step includes a light source for generating visible light.

12. The method as recited in claim 11, further comprising a bubble detecting step in which bubbles contained in the dispensed resin are detected using an image captured by the optical scanner.

13. The method as recited in claim 6, wherein the optical scanner used in the volume measuring step includes a light source for generating visible light, and further comprising a defect detecting step in which presence or absence of a defect in the workpieces is determined using an image captured by the optical scanner, the defect detecting step being performed after the preliminary scanning step, the following steps of the defect detecting step being not performed if the workpieces are determined to be defective.

14. The method as recited in claim 1, wherein the pump and the optical scanner are arranged one after another along a workpiece feeding path, and wherein the preliminary dispensing step, the volume measuring step and the corrective dispensing step are performed while feeding the workpieces along the workpiece feeding path.

15. The method as recited in claim 2, wherein the pump and the optical scanner are arranged one after another along a workpiece feeding path, and wherein the preliminary dispensing step, the volume measuring step and the corrective dispensing step are performed while feeding the workpieces along the workpiece feeding path.

16. The method as recited in claim 3, wherein the pump and the optical scanner are arranged one after another along a workpiece feeding path, and wherein the preliminary dispensing step, the volume measuring step and the corrective dispensing step are performed while feeding the workpieces along the workpiece feeding path.

17. The method as recited in claim 4, wherein the pump and the optical scanner are arranged one after another along a workpiece feeding path, and wherein the preliminary dispensing step, the volume measuring step and the corrective dispensing step are performed while feeding the workpieces along the workpiece feeding path.

* * * * *